(12) United States Patent
Yoshihara et al.

(10) Patent No.: US 8,102,503 B2
(45) Date of Patent: Jan. 24, 2012

(54) EXPOSURE APPARATUS AND METHOD OF MANUFACTURING DEVICE

(75) Inventors: Toshiyuki Yoshihara, Utsunomiya (JP); Yuji Shinano, Fuchu (JP)

(73) Assignee: Canon Kabushiki Kaisha, Tokyo (JP)

( * ) Notice: Subject to any disclaimer, the term of this patent is extended or adjusted under 35 U.S.C. 154(b) by 734 days.

(21) Appl. No.: 12/251,780

(22) Filed: Oct. 15, 2008

(65) Prior Publication Data

US 2009/0103065 A1 Apr. 23, 2009

(30) Foreign Application Priority Data

Oct. 19, 2007 (JP) ................. 2007-273092

(51) Int. Cl.
*G03B 27/32* (2006.01)
*G03B 27/42* (2006.01)
*G03B 27/54* (2006.01)
*G03B 27/68* (2006.01)
*G03B 27/74* (2006.01)

(52) U.S. Cl. ............... 355/52; 355/53; 355/67; 355/68; 355/77

(58) Field of Classification Search .......... 355/52–53, 355/67–68, 77; 356/124–127; 359/649–651, 359/668, 710–711
See application file for complete search history.

(56) References Cited

U.S. PATENT DOCUMENTS

| 7,075,651 | B2 | 7/2006 | Tsukakoshi |
| 7,230,692 | B2 | 6/2007 | Fukagawa et al. |
| 7,301,615 | B2 | 11/2007 | Fukagawa et al. |
| 2010/0302524 | A1* | 12/2010 | Shigenobu et al. ............. 355/67 |

FOREIGN PATENT DOCUMENTS

| JP | 11-176744 A | 7/1999 |
| JP | 2002-367886 A | 12/2002 |
| JP | 2005-268451 A | 9/2005 |
| WO | 02/054036 A1 | 7/2002 |

* cited by examiner

*Primary Examiner* — Hung Henry Nguyen
*Assistant Examiner* — Colin Kreutzer
(74) *Attorney, Agent, or Firm* — Canon U.S.A., Inc., IP Division

(57) ABSTRACT

The present invention provides an exposure apparatus comprising a projection optical system including an optical element of which at least one of a position, orientation, and shape can be regulated, a regulator configured to regulate the at least one of the position, orientation, and shape of the optical element, and a controller configured to calculate, using quadratic programming, a regulation amount of the optical element that minimizes a value of an objective function expressed by a first dummy variable serving as an upper limit of a linear optical characteristic value of the projection optical system, and a second dummy variable serving as an upper limit of a quadratic optical characteristic value of the projection optical system, and to control the regulator based on the calculated regulation amount.

18 Claims, 4 Drawing Sheets

EXPOSURE APPARATUS AND METHOD OF MANUFACTURING DEVICE

BACKGROUND OF THE INVENTION

1. Field of the Invention

The present invention relates to an exposure apparatus and a method of manufacturing a device.

2. Description of the Related Art

A projection exposure apparatus has conventionally been employed to manufacture devices such as a semiconductor device by using photolithography. The apparatus projects and transfers a circuit pattern formed on a reticle (mask) onto a photoresist, which is applied on, for example, a wafer, by a projection optical system.

The projection optical system of the projection exposure apparatus is regulated or adjusted by a process of measuring the optical characteristics (e.g., various aberrations) of the projection optical system, a process of calculating a regulation amount (correction amount) for regulating the optical characteristics based on their measurement values, and a process of regulating the projection optical system based on the calculated regulation amount.

Most optical characteristics (e.g., various aberrations) to be regulated change in proportion to the regulation amount of each element (e.g., an optical element such as a lens), and their absolute values are required to be minimized. To meet this demand, Japanese Patent Laid-Open No. 2002-367886 proposes a technique of determining the regulation amount of each element using the linear programming.

The optical characteristics to be regulated include characteristics, such as the square of the RMS (root mean square) value of the wavefront aberration, which are expressed by the weighted sum of squares of the wavefront aberration coefficients at respective points on the image plane (in the exposure region). In view of this, Japanese Patent Laid-Open No. 2005-268451 proposes a technique of optimizing a linear evaluation value (an optical characteristics value expressed by the linear function of the regulation amount of each element), and a quadratic evaluation value (an optical characteristics value expressed by the quadratic function of the regulation amount of each element) with a good balance for linear constraint expressions.

Japanese Patent Laid-Open No. 11-176744 and International Publication WO 02/054036 pamphlet propose other techniques associated with the regulation of the optical characteristics of the projection optical system.

For example, since a semiconductor device has various circuit patterns, the projection optical system is required to be regulated to maintain a satisfactory imaging performance for all of these various circuit patterns. It is therefore necessary to include, in an objective function for regulating the projection optical system, quadratic optical characteristics, such as the square of the RMS value of a wavefront aberration indicating the aberration in the entire region on the pupil plane of the projection optical system, which are expressed by the weighted sum of squares of the wavefront aberration coefficients at respective points in the exposure region, for example, the Zernike coefficients.

However, Japanese Patent Laid-Open Nos. 2002-367886 and 11-176744 and International Publication WO 02/054036 pamphlet do not take account of quadratic optical characteristics expressed by the weighted sum of squares of the wavefront aberration coefficients.

The projection optical system of the projection exposure apparatus generally has an exposure region as wide as about 26×8 [mm$^2$]. To maintain a satisfactory imaging performance over the entire exposure region, the worst value of the optical characteristics in the exposure region is preferably taken into consideration. The technique disclosed in Japanese Patent Laid-Open No. 2005-268451 includes, in an objective function for regulating the optical system, quadratic optical characteristics expressed by the weighted sum of squares of the wavefront aberration coefficients. However, the technique disclosed in Japanese Patent Laid-Open No. 2005-268451 takes account of a quadratic optical characteristics value at one point in the exposure region, or the sum of quadratic optical characteristics values at a plurality of points in the exposure region. For this reason, the technique disclosed in Japanese Patent Laid-Open No. 2005-268451 cannot determine an optimum regulation amount that minimizes the worst value of the quadratic optical characteristics in the exposure region. Still worse, the technique disclosed in Japanese Patent Laid-Open No. 2005-268451 includes a process of determining a regulation amount that minimizes the linear evaluation value, and a process of determining a regulation amount that minimizes the quadratic evaluation value under constraints based on the processing result, and these processes must be repeated until the linear evaluation value and the quadratic evaluation value are balanced.

SUMMARY OF THE INVENTION

The present invention provides a new technique of calculating the regulation amount of an element for changing the optical characteristic value.

According to the first aspect of the present invention, there is provided an exposure apparatus for exposing a substrate to radiant energy via a pattern of a reticle, the apparatus comprising a projection optical system including an optical element of which at least one of a position, orientation, and shape can be regulated, and configured to project light from the pattern onto the substrate, a regulator configured to regulate the at least one of the position, orientation, and shape of the optical element, and a controller configured to calculate, using quadratic programming, a regulation amount of the optical element that minimizes a value of an objective function expressed by a first dummy variable serving as an upper limit of a linear optical characteristic value of the projection optical system that is expressed by a linear function of a regulation amount of the optical element by the regulator, and a second dummy variable serving as an upper limit of a quadratic optical characteristic value of the projection optical system that is expressed by a quadratic function of a regulation amount of the optical element by the regulator, and to control the regulator based on the calculated regulation amount.

According to the second aspect of the present invention, there is provided an exposure apparatus for exposing a substrate to radiant energy via a pattern of a reticle, the apparatus comprising a projection optical system including an optical element of which at least one of a position, orientation, and shape can be regulated, and configured to project light from the pattern onto the substrate, a regulator configured to regulate the at least one of the position, orientation, and shape of the optical element, and a controller configured to calculate, using quadratic cone programming, a regulation amount of the optical element, that minimizes a value of an objective function expressed by a first dummy variable serving as an upper limit of a linear optical characteristic value of the projection optical system that is expressed by a linear function of a regulation amount of the optical element by the regulator, and a second dummy variable serving as an upper limit of a quadratic optical characteristic value of the projection optical system expressed by a quadratic function of a regulation amount of the optical element by the regulator, and to control the regulator based on the calculated regulation amount.

According to the third aspect of the present invention, there is provided a method of manufacturing a device, the method comprising exposing a substrate to radiant energy using an exposure apparatus, developing the exposed substrate, and processing the developed substrate to manufacture the device, wherein the exposure apparatus includes a projection optical system including an optical element of which at least one of a position, orientation, and shape can be regulated, and configured to project light from the pattern onto the substrate, a regulator configured to regulate the at least one of the position, orientation, and shape of the optical element, and a controller configured to calculate, using quadratic programming, a regulation amount of the optical element that minimizes a value of an objective function expressed by a first dummy variable serving as an upper limit of a linear optical characteristic value of the projection optical system that is expressed by a linear function of a regulation amount of the optical element by the regulator, and a second dummy variable serving as an upper limit of a quadratic optical characteristic value of the projection optical system that is expressed by a quadratic function of a regulation amount of the optical element by the regulator, and to control the regulator based on the calculated regulation amount.

According to the third aspect of the present invention, there is provided a method of manufacturing a device, the method comprising exposing a substrate to radiant energy using an exposure apparatus, developing the exposed substrate, and processing the developed substrate to manufacture the device, wherein the exposure apparatus includes a projection optical system including an optical element of which at least one of a position, orientation, and shape can be regulated, and configured to project light from the pattern onto the substrate, a regulator configured to regulate the at least one of the position, orientation, and shape of the optical element, and a controller configured to calculate, using quadratic cone programming, a regulation amount of the optical element, that minimizes a value of an objective function expressed by a first dummy variable serving as an upper limit of a linear optical characteristic value of the projection optical system that is expressed by a linear function of a regulation amount of the optical element by the regulator, and a second dummy variable serving as an upper limit of a quadratic optical characteristic value of the projection optical system expressed by a quadratic function of a regulation amount of the optical element by the regulator, and to control the regulator based on the calculated regulation amount.

Further features of the present invention will become apparent from the following description of exemplary embodiments with reference to the attached drawings.

DESCRIPTION OF THE EMBODIMENT

Figure 1:
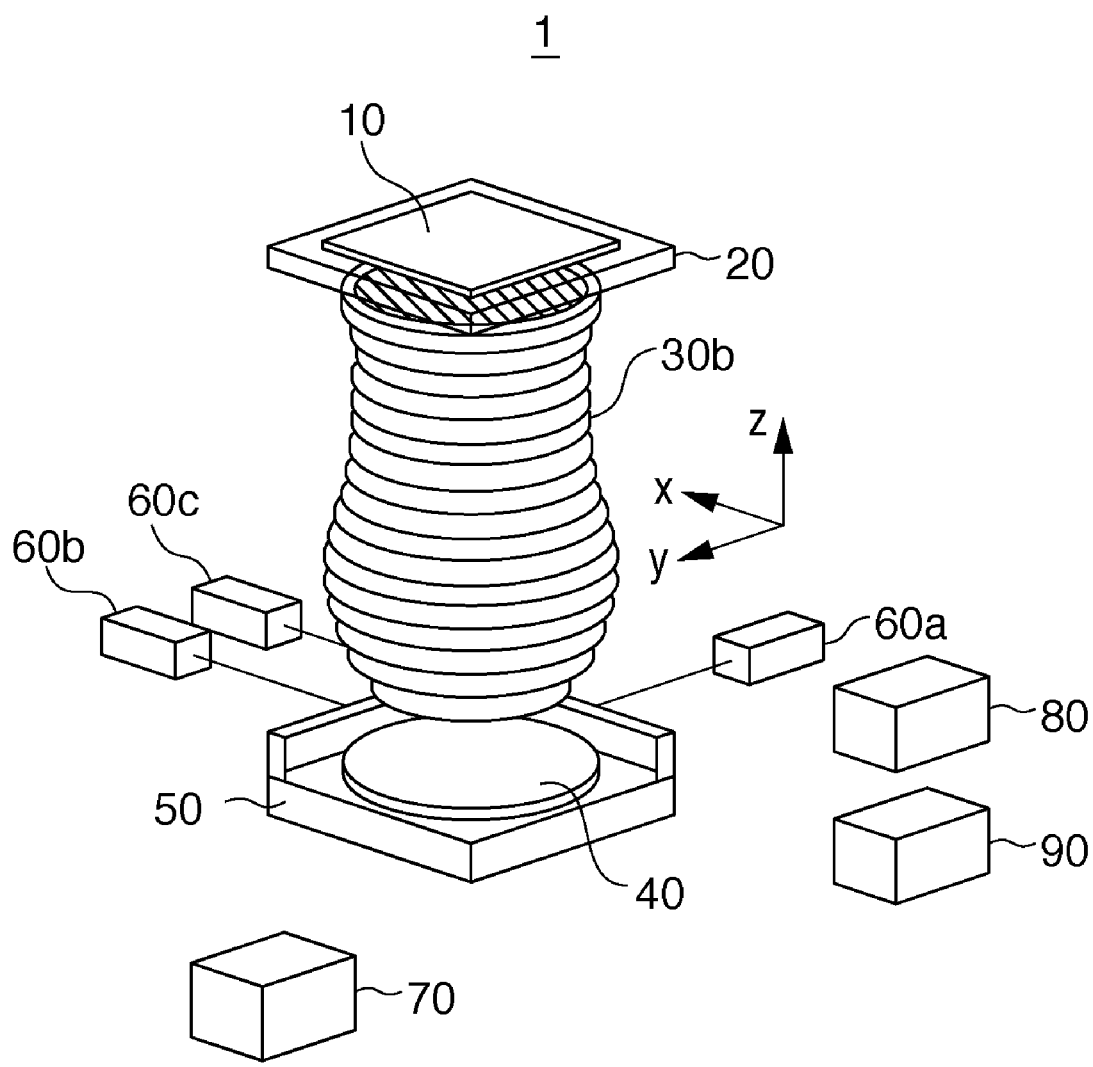
FIG. 1 is a schematic perspective view showing the arrangement of an exposure apparatus according to one aspect of the present invention.

A preferred embodiment of the present invention will be described below with reference to the accompanying drawings. The same reference numerals denote the same members throughout the drawings, and a repetitive description thereof will not be given.

FIG. 1 is a schematic perspective view showing the arrangement of an exposure apparatus 1 according to one aspect of the present invention. In this embodiment, the exposure apparatus 1 is a projection exposure apparatus which transfers the pattern of a reticle 10 onto a wafer 40 using the step & scan scheme. However, the exposure apparatus 1 can adopt the step & repeat scheme or another exposure scheme.

The exposure apparatus 1 includes an illumination optical system (not shown), a reticle stage 20 for holding the reticle 10, a projection optical system 30, a wafer stage 50 for holding the wafer 40, laser interferometers 60a, 60b, and 60c, a measurement unit 70, a regulator 80, and a controller 90.

The illumination optical system (not shown) illuminates the reticle 10, onto which a circuit pattern is formed, with a light beam from a light source such as a KrF excimer laser having a wavelength of about 248 nm, an ArF excimer laser having a wavelength of about 193 nm, or an $F_2$ laser having a wavelength of about 157 nm.

The reticle 10 has a circuit pattern and is supported and driven by the reticle stage 20. Diffracted light generated by the reticle 10 is projected onto the wafer 40 via the projection optical system 30.

The reticle stage 20 supports the reticle 10 and moves the reticle 10 using, for example, a linear motor. The reticle stage 20 has a function of regulating at least one of the position and orientation of the reticle 10 under the control of the controller 90 (to be described later).

The projection optical system 30 includes a plurality of optical elements (e.g., optical components such as a lens and aperture stop) and projects the pattern of the reticle 10 onto the wafer 40. The regulator 80 (to be described later) can regulate at least one of the positions, orientations, and shapes of some of the plurality of optical elements included in the projection optical system 30.

The wafer 40 is a substrate onto which the pattern of the reticle 10 is projected (transferred). However, the wafer 40 can be substituted by a glass plate or another substrate.

The wafer stage 50 supports the wafer 40 and moves it using, for example, a linear motor. The wafer stage 50 has a function of regulating at least one of the position and orientation of the wafer 40 under the control of the controller 90.

The laser interferometers 60a, 60b, and 60c are arranged near the wafer stage 50, and measure the position of the wafer stage 50.

The measurement unit 70 measures optical characteristics in the exposure apparatus 1 and, in particular, those of the projection optical system 30. The measurement unit 70 includes, for example, an interferometer and light intensity sensor, and has a function of measuring the wavefront aberration at each point in the exposure region of the projection optical system 30. The measurement unit 70 also has a function of measuring a distortion as the aberration of the projection optical system 30. Note that the distortion is a quantity that indicates the degree of shift of an actual image height on the image plane from an ideal image height, and can be measured at each point on the image plane (in the exposure region). Since the measurement unit 70 can take any form known to those skilled in the art, a detailed description of the structure and operation thereof will not be given herein.

The regulator 80 regulates at least one of the positions, orientations, and shapes of some of the plurality of optical elements included in the projection optical system 30 under the control of the controller 90. The regulator 80 is formed from, for example, a mechanism which drives the optical element in the optical axis direction (the Z-axis direction in FIG. 1) and a direction perpendicular to the optical axis direction, that which drives a supporting unit for supporting the optical element, and that which applies a stress (a force which pushes or pulls the optical element) to the optical element.

The controller 90 includes a CPU and memory (not shown) and controls the operation of the exposure apparatus 1. The controller 90 controls, for example, the scanning speeds of the reticle stage 20 and wafer stage 50. In this embodiment, the controller 90 calculates the regulation amounts of the optical element of the projection optical system 30 and the wafer stage 50 by the regulator 80 using the quadratic programming or quadratic cone programming (second-order cone programming), based on the measurement result obtained by the measurement unit 70. The controller 90 controls the regulator 80 and wafer stage 50 based on the regulation amounts of the optical element of the projection optical system 30 and the wafer stage 50, which are calculated by using the quadratic programming or quadratic cone programming. Note that how to calculate the regulation amounts of the optical element of the projection optical system 30 and the wafer stage 50 by the controller 90 will be explained in detail later.

Figure 2:
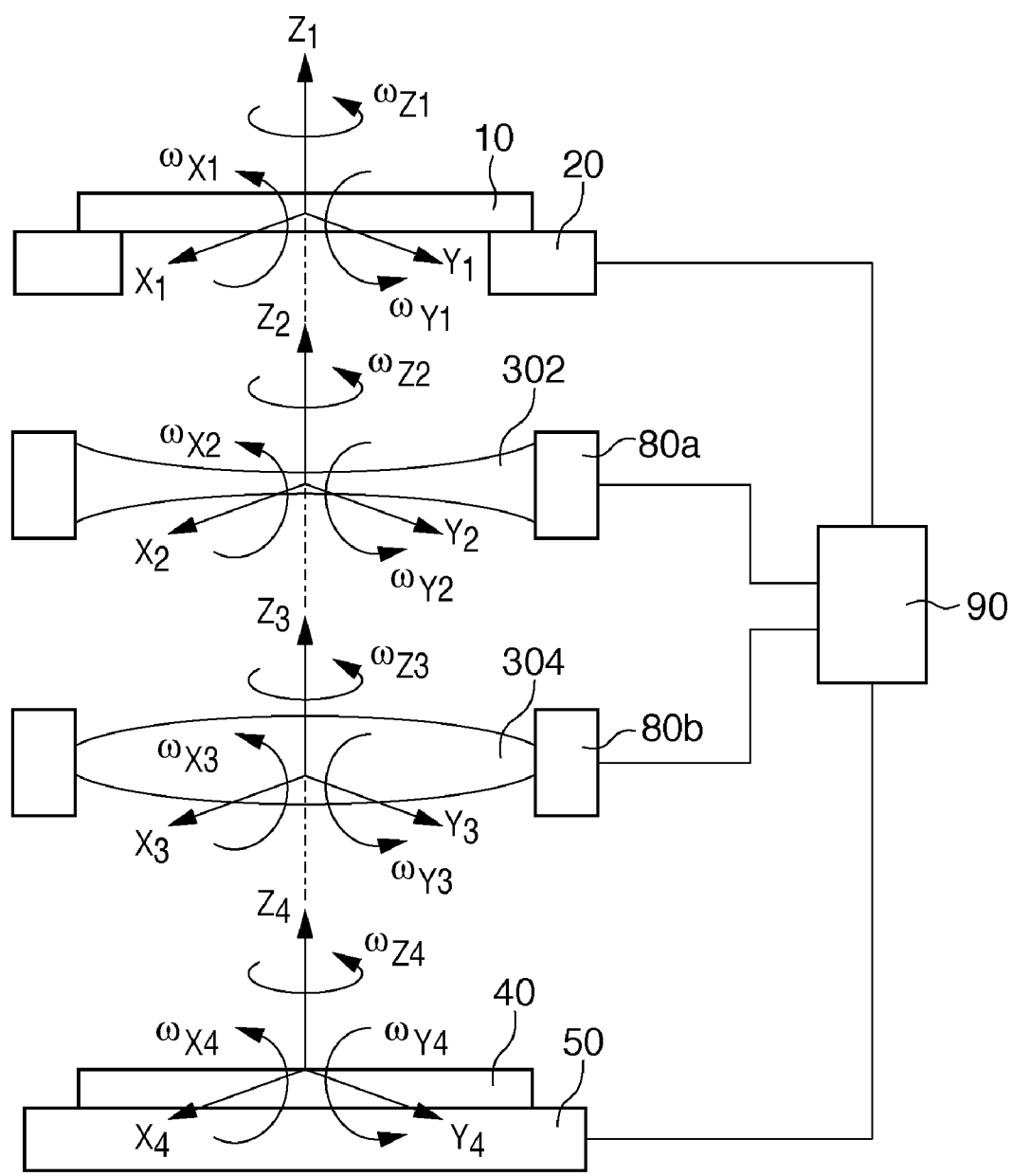
FIG. 2 is a diagram schematically showing an example of the directions in which a reticle, a wafer, and an optical element included in a projection optical system can move (their driving directions) in the exposure apparatus shown in FIG. 1.

FIG. 2 is a diagram schematically showing an example of the directions in which the reticle 10, the wafer 40, and optical elements 302 and 304 included in the projection optical system 30 can move (their driving directions). The position of the reticle 10 is regulated in the directions of six degrees of freedom (i.e., the directions indicated by arrows $X_1$, $Y_1$, $Z_1$, $\omega_{X1}$, $\omega_{Y1}$, and $\omega_{Z1}$) via the reticle stage 20 controlled by the controller 90. Likewise, the position of the wafer 40 is regulated in the directions of six degrees of freedom (i.e., the directions indicated by arrows $X_4$, $Y_4$, $Z_4$, $\omega_{X4}$, $\omega_{Y4}$, and $\omega_{Z4}$) via the wafer stage 50 controlled by the controller 90. The position of the optical element 302 is regulated in the directions of six degrees of freedom (i.e., the directions indicated by arrows $X_2$, $Y_2$, $Z_2$, $\omega_{X2}$, $\omega_{Y2}$, and $\omega_{Z2}$) via a driving mechanism 80a serving as the regulator 80 controlled by the controller 90. Likewise, the position of the optical element 304 is regulated in the directions of six degrees of freedom (i.e., the directions indicated by arrows $X_3$, $Y_3$, $Z_3$, $\omega_{X3}$, $\omega_{Y3}$, and $\omega_{Z3}$) via a driving mechanism 80b serving as the regulator 80 controlled by the controller 90.

Figure 3:
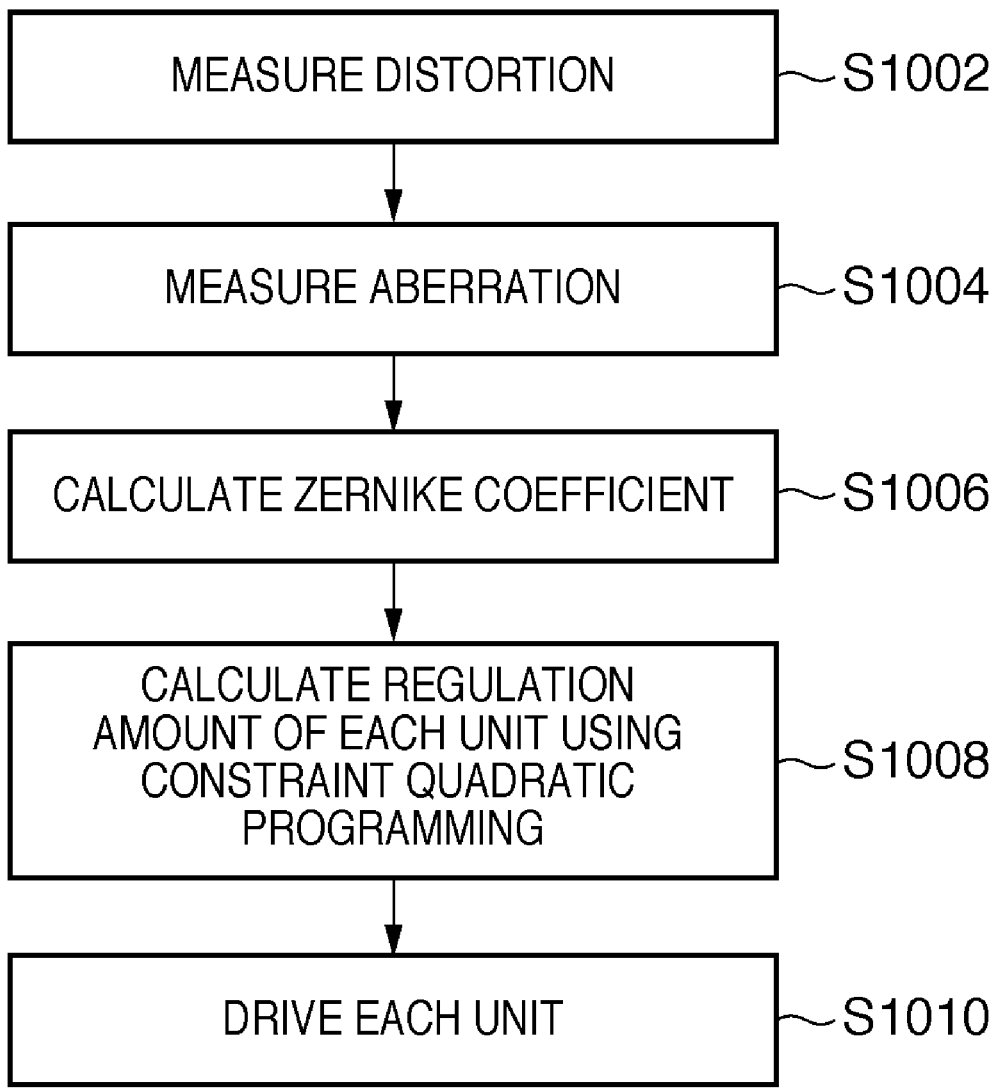
FIG. 3 is a flowchart for explaining automatic regulation or adjustment of the projection optical system in the exposure apparatus shown in FIG. 1.

A method of regulating the optical characteristics (e.g., the wavefront aberration) of the projection optical system 30 will be explained below. FIG. 3 is a flowchart for explaining automatic regulation of the projection optical system 30 in the exposure apparatus 1. The automatic regulation of the projection optical system 30 is controlled by the controller 90.

Referring to FIG. 3, the distortion of the projection optical system 30 is measured via the measurement unit 70 in step S1002. In step S1004, the aberration (wavefront aberration) of the projection optical system 30 is measured via the measurement unit 70. More specifically, the wavefront aberrations at H measurement points in the exposure region of the projection optical system 30 are measured.

In step S1006, the controller 90 expands by J Zernike orthogonal functions the wavefront aberration at a measurement point h in the exposure region of the projection optical system 30, which is measured in step S1004, and calculates a Zernike coefficient $Z_{jh}$ corresponding to each measurement point. This makes it possible to calculate an optical characteristics value having linear characteristics with respect to the amounts of wavefront aberrations such as the line width asymmetry, curvature of field, and astigmatism, based on the Zernike coefficients (wavefront aberration coefficients) at the H measurement points in the exposure region of the projection optical system 30. This optical characteristics value is expressed by the linear function of each of the regulation amounts of the reticle stage 20, wafer stage 50, and optical elements 302 and 304, and will be called a linear optical characteristics value in this embodiment. It is also possible to calculate an optical characteristics value, such as the square of the RMS value of the wavefront aberration, which is expressed by the sum of products of the square of the j-th Zernike coefficient $Z_{jh}$ at the measurement point h in the exposure region of the projection optical system 30, and the weighting coefficient for each Zernike component. This optical characteristics value is expressed by the quadratic function of each of the regulation amounts of the reticle stage 20, wafer stage 50, and optical elements 302 and 304, and will be called a quadratic optical characteristics value in this embodiment.

The linear optical characteristics value, quadratic optical characteristics value, and distortion will be explained herein. Note that subscripts h, i, j, k, and m used hereinafter are defined by:

$$h = 1, 2, \ldots, H \quad (1)$$

$$i = 1, 2, \ldots, I \quad (2)$$

$$j = 1, 2, \ldots, J \quad (3)$$

$$k = 1, 2, \ldots, K \quad (4)$$

$$m = 1, 2, \ldots, M \quad (5)$$

The i-th linear optical characteristics value $y_{ih}$ at the measurement point h in the exposure region of the projection optical system 30 is expressed by the linear combination of the Zernike coefficient $Z_{jh}$:

$$y_{ih} = \sum_{j=1}^{J} a_{ij} Z_{jh} \quad (i = 1, 2, \ldots, I; h = 1, 2, \ldots, H) \quad (6)$$

where $a_{ij}$ is the degree of influence of the j-th Zernike coefficient on the i-th linear optical characteristics value. The j-th Zernike coefficient $Z_{jh}$ at the measurement point h when the regulation amount of each unit (each of the reticle stage 20, wafer stage 50, and optical elements 302 and 304) is changed is expressed by the linear combination of the k-th regulation amount $x_k$ of each unit:

$$Z_{jh} = Z_{0jh} + \sum_{k=1}^{K} b_{hjk} x_k \quad (j = 1, 2, \ldots, I; h = 1, 2, \ldots, H) \quad (7)$$

where $Z_{0jh}$ is the initial value of the j-th Zernike coefficient at the measurement point h, and $b_{hjk}$ is the degree of influence of the regulation amount $x_k$ of each unit on the j-th Zernike coefficient at the measurement point h.

From equations (6) and (7), we have:

$$y_{ih} = \sum_{j=1}^{J} a_{ij} z_{0jh} + \sum_{k=1}^{K} \sum_{j=1}^{J} a_{ij} b_{hjk} x_k \quad (i = 1, 2, \ldots, I; h = 1, 2, \ldots, H) \quad (8)$$

The distortion at the measurement point h is also a linear optical characteristics value expressed by a linear function with respect to the k-th regulation amount $x_k$ of each unit. Hence, when the regulation amount of each unit (each of the reticle stage 20, wafer stage 50, and optical elements 302 and 304) is changed, a distortion uh at the measurement point h is expressed by the linear combination of the k-th regulation amount $x_k$ of each unit:

$$u_h = u_{0h} + \sum_{k=1}^{K} c_{hk} x_k \quad (h = 1, 2, \ldots, H) \quad (9)$$

where $u_{0h}$ is the initial value of the distortion at the measurement point h, and $c_{hk}$ is the degree of influence of the regulation amount $x_k$ of each unit on the distortion at the measurement point h.

The m-th quadratic optical characteristics value $W_{mh}$ at the measurement point h in the exposure region of the projection optical system 30 is expressed by:

$$W_{mh} = \sum_{j=1}^{J} d_{jm} Z_{jh}^2 \quad (m = 1, 2, \ldots, M; h = 1, 2, \ldots, H) \quad (10)$$

where $d_{jm}$ is the degree of influence of the j-th Zernike coefficient on the m-th quadratic optical characteristics value.

From equations (10) and (7), we have:

$$W_{mh} = \sum_{j=1}^{J} d_{jm} \left( z_{0jh} + \sum_{k=1}^{K} b_{hjk} x_k \right)^2 \quad (m = 1, 2, \ldots, M; h = 1, 2, \ldots, H) \quad (11)$$

which represents M quadratic optical characteristics values $W_{mh}$ at the measurement point h.

Because the regulation amount $x_k$ of each unit has a physical limit, it satisfies:

$$L_k \leq x_k \leq U_k \ (k=1, 2, \ldots, K) \quad (12)$$

where $L_k$ is the lower limit of the k-th regulation amount $x_k$ of each unit, and $U_k$ is the upper limit of the k-th regulation amount $x_k$ of each unit.

In step S1008, the controller 90 generates, using the quadratic programming (constraint quadratic programming), constraint expressions for minimizing the linear optical characteristics value, distortion, and quadratic optical characteristics value, and calculates the regulation amount of each unit (e.g., the regulation amount of each of the optical elements 302 and 304).

Step S1008 will be explained in detail. The regulation ranges of the linear optical characteristics value, the distortion, and the regulation amount of each unit are determined by constraints based on the linear programming using dummy variables proposed in International Publication WO 02/054036 pamphlet:

$$\sum_{j=1}^{J} a_{ij} z_{0jh} + \sum_{k=1}^{K} \sum_{j=1}^{J} a_{ij} b_{hjk} x_k \leq t_{1i} \ (i = 1, 2, \ldots, I; h = 1, 2, \ldots, H) \quad (13)$$

$$-\sum_{j=1}^{J} a_{ij} z_{0jh} - \sum_{k=1}^{K} \sum_{j=1}^{J} a_{ij} b_{hjk} x_k \leq t_{1i} \ (i = 1, 2, \ldots, I; h = 1, 2, \ldots, H) \quad (14)$$

$$u_{0h} + \sum_{k=1}^{K} c_{hk} x_k \leq t_2 \ (h = 1, 2, \ldots, H) \quad (15)$$

$$-u_{0h} - \sum_{k=1}^{K} c_{hk} x_k \leq t_2 \ (h = 1, 2, \ldots, H) \quad (16)$$

$$0 \leq t_{1i} \ (i=1, 2, \ldots, I) \quad (17)$$

$$0 \leq t_2 \quad (18)$$

$$-x_k \leq -L_k \ (k=1, 2, \ldots, K) \quad (19)$$

$$x_k \leq U_k \ (k=1, 2, \ldots, K) \quad (20)$$

where $t_{1i}$ on the right side of relation (17), and $t_2$ on the right side of relation (18) are dummy variables (first dummy variables) corresponding to the upper limit of the linear optical characteristics value.

In other words, relations (13) to (20) are constraint expressions of an optimization problem.

To minimize a quadratic optical characteristics value expressed by the weighted sum of squares of the Zernike coefficients by the constraint quadratic programming, an upper limit $Z_{ajh}$ of the absolute value of the j-th Zernike coefficient at the measurement point h is expressed by:

$$Z_{0jh} + \sum_{k=1}^{K} b_{hjk} x_k \leq Z_{ajh} \ (j = 1, 2, \ldots, J; h = 1, 2, \ldots, H) \quad (21)$$

$$-Z_{0jh} - \sum_{k=1}^{K} b_{hjk} x_k \leq Z_{ajh} \ (j = 1, 2, \ldots, J; h = 1, 2, \ldots, H) \quad (22)$$

As is obvious from relations (21) and (22), the upper limit $Z_{ajh}$ always takes a nonnegative value.

When constraint expressions:

$$\sum_{j=1}^{J} d_{jm} Z_{ajh} Z_{ajh} \leq t_{3m} \ (m = 1, 2, \ldots, M; h = 1, 2, \ldots, H) \quad (23)$$

$$0 \leq Z_{ajh} \ (j=1, 2, \ldots, J; h=1, 2, \ldots, H) \quad (24)$$

$$0 \leq t_{3m} \ (m=1, 2, \ldots, M) \quad (25)$$

where $t_{3m}$ on the right sides of relations (23) and (25) are dummy variables (second dummy variables) corresponding to the upper limit of the quadratic optical characteristics value, are added to the above-described constraint expressions, we have a constraint quadratic programming problem, an optimum solution of which can be calculated. This makes it possible to minimize the worst value of the quadratic optical characteristics value in the exposure region of the projection optical system 30.

In this manner, a constraint quadratic programming problem defined by:

Minimization:

$$f = \frac{1}{Y_i}\sum_{i=1}^{I} t_{1i} + \frac{1}{U}t_2 + \frac{1}{W_m}\sum_{m=1}^{M} t_{3m} \quad (26)$$

Constraints:

$$\sum_{j=1}^{J} a_{ij}Z_{0jh} + \sum_{k=1}^{K}\sum_{j=1}^{J} a_{ij}b_{hjk}x_k \le t_{1i} \ (i=1,2,\ldots,I; h=1,2,\ldots,H) \quad (13)$$

$$-\sum_{j=1}^{J} a_{ij}Z_{0jh} - \sum_{k=1}^{K}\sum_{j=1}^{J} a_{ij}b_{hjk}x_k \le \quad (14)$$

$$t_{1i} \ (i=1,2,\ldots,I; h=1,2,\ldots,H)$$

$$u_{0h} + \sum_{k=1}^{K} c_{hk}x_k \le t_2 \ (h=1,2,\ldots,H) \quad (15)$$

$$-u_{0h} - \sum_{k=1}^{K} c_{hk}x_k \le t_2 \ (h=1,2,\ldots,H) \quad (16)$$

$$Z_{0jh} + \sum_{k=1}^{K} b_{hjk}x_k \le Z_{ajh} \ (j=1,2,\ldots,J; h=1,2,\ldots,H) \quad (21)$$

$$-Z_{0jh} - \sum_{k=1}^{K} b_{hjk}x_k \le Z_{ajh} \ (j=1,2,\ldots,J; h=1,2,\ldots,H) \quad (22)$$

$$\sum_{j=1}^{J} d_{jm}Z_{ajh}Z_{ajh} \le t_{3m} \ (m=1,2,\ldots,M; h=1,2,\ldots,H) \quad (23)$$

$$0 \le Z_{ajh} \ (j=1,2,\ldots,J; h=1,2,\ldots,H) \quad (24)$$

$$0 \le t_{1i} \ (i=1,2,\ldots,I) \quad (17)$$

$$0 \le t_2 \quad (18)$$

$$0 \le t_{3m} \ (m=1,2,\ldots,M) \quad (25)$$

$$-x_k \le -L_k \ (k=1,2,\ldots,K) \quad (19)$$

$$x_k \le U_k \ (k=1,2,\ldots,K) \quad (20)$$

is generated.

The objective function expressed by equation (26) is preferably normalized by dividing each optical characteristics value by a permissible value, in order to optimize the optical characteristics of the projection optical system 30 with a good balance. This makes it possible to minimize a plurality of aberrations with a good balance.

From relations (13) to (26), the regulation amount of each unit (each of the reticle stage 20, wafer stage 50, and optical elements 302 and 304) is calculated.

As the regulation amount of each unit (each of the reticle stage 20, wafer stage 50, and optical elements 302 and 304) is calculated, the controller 90 drives each unit in step S1010. With this operation, the optical characteristics of the projection optical system 30 are regulated (i.e., the aberration of the projection optical system 30 is corrected).

A formulated constraint quadratic programming problem always has an optimum solution, which can be calculated. Hence, when optimized calculation is performed using a calculation program for the constraint quadratic programming problem (constraint quadratic programming solver) based on the above-described formulation method, it is possible to calculate the regulation amount (control variable) of each unit, for minimizing the worst values of the linear optical characteristics value and quadratic optical characteristics value.

The method of regulating the projection optical system 30 according to this embodiment can obtain an optimum regulation amount of each unit, for regulating optical characteristics including the weighted sum of squares of Zernike coefficients which represent the wavefront aberrations of the projection optical system 30. This method also can obtain a regulation amount of each unit, for maintaining the optical characteristics value at each point in the exposure region (i.e., in the entire exposure region) within an appropriate range (i.e., an allowance) using a very simple process.

Figure 4:
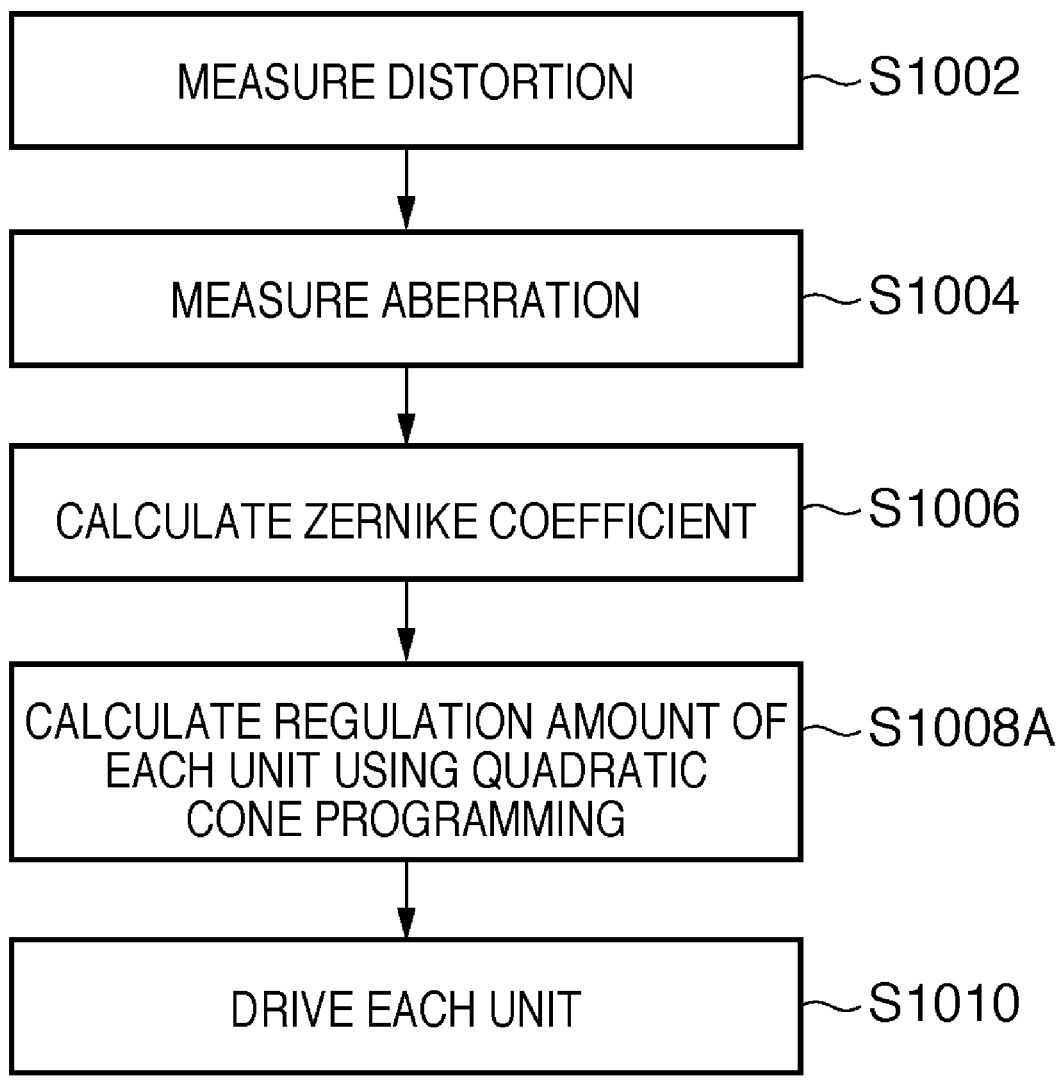
FIG. 4 is a flowchart for explaining another automatic regulation of the projection optical system in the exposure apparatus shown in FIG. 1.

Automatic regulation of the projection optical system 30 may be performed using the quadratic cone programming (second-order cone programming), as shown in FIG. 4. FIG. 4 is a flowchart for explaining automatic regulation of the projection optical system 30 in the exposure apparatus 1. Note that measurement of the distortion of the projection optical system 30 (step S1002), measurement of the wavefront aberration of the projection optical system 30 (step S1004), and calculation of the Zernike coefficient (step S1006) are the same as those in the flowchart shown in FIG. 3.

In step S1008A, the controller 90 generates, using the quadratic cone programming, constraint expressions for minimizing the linear optical characteristics value, distortion, and quadratic optical characteristics value, and calculates the regulation amount of each unit (e.g., the regulation amount of each of the optical elements 302 and 304).

More specifically, when relations (13) to (26) are rewritten as equivalent expressions:

Minimization:

$$f = \frac{1}{Y_i}\sum_{i=1}^{I} t_{1i} + \frac{1}{U}t_2 + \frac{1}{W_m}\sum_{m=1}^{M} t_{3m} \quad (27)$$

Constraints:

$$0 \le -\sum_{k=1}^{K}\sum_{j=1}^{J} a_{ij}b_{hjk}x_k + t_{1i} - \quad (28)$$

$$\sum_{j=1}^{J} a_{ij}Z_{0jh} \ (i=1,2,\ldots,I; h=1,2,\ldots,H)$$

$$0 \le \sum_{k=1}^{K}\sum_{j=1}^{J} a_{ij}b_{hjk}x_k + \sum_{j=1}^{J} a_{ij}Z_{0jh} \ (i=1,2,\ldots,I; h=1,2,\ldots,H) \quad (29)$$

$$0 \le -\sum_{k=1}^{K} c_{hk}x_k + t_2 - u_{0h} \ (h=1,2,\ldots,H) \quad (30)$$

-continued $$0 \leq \sum_{k=1}^{K} c_{hk} x_k + t_2 + u_{0h} \quad (h = 1, 2, \ldots, H) \quad (31)$$

$$\left\| \begin{pmatrix} B_{hm} & 0 \\ -\frac{\alpha_{hm}^T}{2} & \frac{1}{2} \end{pmatrix} \begin{pmatrix} s \\ t_{3m} \end{pmatrix} + \begin{pmatrix} 0 \\ -\frac{\beta_{hm}+1}{2} \end{pmatrix} \right\| \leq \quad (32)$$

$$\left( -\frac{\alpha_{hm}^T}{2} \frac{1}{2} \right) \begin{pmatrix} s \\ t_{3m} \end{pmatrix} + -\frac{\beta_{hm}+1}{2} \quad (m = 1, 2, \ldots, M; h = 1, 2, \ldots, H)$$

$$1, 2, \ldots, M; h = 1, 2, \ldots, H \quad (32)$$

$$0 \leq t_{1i} \, (i=1, 2, \ldots, I) \quad (33)$$

$$0 \leq t_2 \quad (34)$$

$$0 \leq t_{3m} \quad (35)$$

$$-x_k \leq -L_k \, (k=1, 2, \ldots, K) \quad (36)$$

$$x_k \leq U_k \, (k=1, 2, \ldots, K) \quad (37)$$

where $s$, $B_{hm}$, $\alpha_{hm}$, and $\beta_{hm}$ are:

$$s = \begin{pmatrix} x_1 \\ x_2 \\ \vdots \\ x_k \end{pmatrix} \quad (38)$$

$$B_{hm} = \begin{pmatrix} d_{1m} b_{h11} & d_{1m} b_{h12} & \cdots & d_{1m} b_{h1K} \\ d_{2m} b_{h21} & d_{2m} b_{h22} & \cdots & d_{2m} b_{h2K} \\ \vdots & \vdots & \cdots & \vdots \\ d_{Jm} b_{hJ1} & d_{Jm} b_{hJ2} & \cdots & d_{Jm} b_{hJK} \end{pmatrix} \quad (39)$$

$$(m = 1, 2, \ldots, M; h = 1, 2, \ldots, H)$$

$$\alpha_{hm} = \begin{pmatrix} 2 \sum_{j=1}^{J} d_{jm}^2 b_{hj1} Z_{0jh} \\ 2 \sum_{j=1}^{J} d_{jm}^2 b_{hj2} Z_{0jh} \\ \vdots \\ 2 \sum_{j=1}^{J} d_{jm}^2 b_{hjK} Z_{0jh} \end{pmatrix} \quad (40)$$

$$(m = 1, 2, \ldots, M; h = 1, 2, \ldots, H)$$

$$\beta_{hm} = \sum_{j=1}^{J} d_{jm}^2 Z_{0jh}^2 \quad (m = 1, 2, \ldots, M; h = 1, 2, \ldots, H) \quad (41)$$

a quadratic cone programming problem occurs, an optimum solution of which can be calculated. This makes it possible to minimize the worst value of the quadratic optical characteristics value in the exposure region of the projection optical system 30.

As described above, relations (27) to (41) are obtained by rewriting relations (13) to (26), and define a quadratic cone programming problem using $\{x_k, t_{1i}, t_2, t_{3m}\}$ as variables.

From relations (27) to (41), the regulation amount of each unit (each of the reticle stage 20, wafer stage 50, and optical elements 302 and 304) is calculated.

As the regulation amount of each unit (each of the reticle stage 20, wafer stage 50, and optical elements 302 and 304) is calculated, the controller 90 drives each unit in step S1010.

With this operation, the optical characteristics of the projection optical system 30 are regulated (i.e., the aberration of the projection optical system 30 is corrected).

A formulated quadratic cone programming problem always has an optimum solution, which can be calculated. Hence, when optimized calculation is performed using a calculation program for the quadratic or second-order cone programming problem (quadratic cone programming solver) based on the above-described formulation method, it is possible to calculate the regulation amount (control variable) of each unit, for minimizing the worst values of the linear optical characteristics value and quadratic optical characteristics value. In addition, the exposure apparatus 1 according to this embodiment completes the above-described calculation in a short period of time because of the use of a small number of control variables. This makes it possible to stably maintain a high throughput when the exposure apparatus 1 corrects the aberration in real time.

The regulation amount $x_k$ of each unit as a control variable includes the regulation amounts of the wafer stage 50 (e.g., the amounts of focus regulation and alignment regulation). Even when the wavefront aberration at each point in the exposure region of the projection optical system 30 contains a defocus component, the method of regulating the projection optical system 30 according to this embodiment can obtain the regulation amount of each unit free from any influence of the defocus component. Likewise, even when the distortion at each point in the exposure region of the projection optical system 30 contains an alignment component, the method of regulating the projection optical system 30 according to this embodiment can obtain the regulation amount of each unit free from any influence of the alignment component.

In exposure, a light beam emitted by the light source illuminates the reticle 10 by the illumination optical system. The light beam which reflects the pattern of the reticle 10 forms an image on the wafer 40 by the projection optical system 30. Since the optical characteristics in the exposure region of the projection optical system 30 is optimally regulated by the above-described regulation method, the projection optical system 30 can project the pattern of the reticle 10 onto the wafer 40 with an excellent imaging performance. Hence, the exposure apparatus 1 can provide devices (e.g., a semiconductor device, an LCD device, an image sensing device (e.g., a CCD), and a thin-film magnetic head) with a high throughput and a good economical efficiency. These devices are manufactured by a step of exposing a substrate (e.g., a wafer or glass plate) coated with a resist (photosensitive agent) using the exposure apparatus 1, a step of developing the exposed substrate, and other known steps. The other known steps can be processes such as oxidation, film formation, vapor deposition, doping, planarization, etching, resist stripping, dicing, bonding, and packaging.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-273092 filed on Oct. 19, 2007, which is hereby incorporated by reference herein in its entirety.

What is claimed is:

1. An exposure apparatus for exposing a substrate to radiant energy via a pattern of a reticle, the apparatus comprising:

a projection optical system including an optical element of which at least one of a position, orientation, and shape can be regulated, and configured to project light from the pattern onto the substrate;

a regulator configured to regulate the at least one of the position, orientation, and shape of the optical element; and a controller configured to calculate, using quadratic programming, a regulation amount of the optical element that minimizes a value of an objective function expressed by a first dummy variable serving as an upper limit of a linear optical characteristic value of the projection optical system that is expressed by a linear function of a regulation amount of the optical element by the regulator, and a second dummy variable serving as an upper limit of a quadratic optical characteristic value of the projection optical system that is expressed by a quadratic function of a regulation amount of the optical element by the regulator, and to control the regulator based on the calculated regulation amount.

2. The apparatus according to claim 1, wherein the linear optical characteristic value is a value of an optical characteristic expressed by a linear combination of wavefront aberration coefficients.

3. The apparatus according to claim 1, wherein the linear optical characteristic value is a value of a distortion as an aberration of the projection optical system.

4. The apparatus according to claim 1, wherein the quadratic optical characteristic value is a value of an optical characteristic expressed by a weighted sum of squares of wavefront aberration coefficients.

5. The apparatus according to claim 4, wherein the wavefront aberration coefficients are Zernike coefficients.

6. The apparatus according to claim 1, wherein the quadratic optical characteristic value is a square of an RMS value of wavefront aberration.

7. The apparatus according to claim 1, further comprising a stage device configured to hold the substrate and regulate at least one of a position and orientation of the substrate, wherein the linear optical characteristic value includes an optical characteristic value of the projection optical system expressed by a linear function of a regulation amount of the substrate by the stage device, the quadratic optical characteristic value includes an optical characteristic value of the projection optical system expressed by a quadratic function of a regulation amount of the substrate by the stage device, and the controller is configured to calculate the regulation amount of the optical element and the regulation amount of the substrate, that minimize the objective function, and to control the regulator and the stage device based on the calculated regulation amounts.

8. The apparatus according to claim 1, further comprising a stage device configured to hold the reticle and regulate at least one of a position and orientation of the reticle, wherein the linear optical characteristic value includes an optical characteristic value of the projection optical system expressed by a linear function of a regulation amount of the reticle by the stage device, the quadratic optical characteristic value includes an optical characteristic value of the projection optical system expressed by a quadratic function of a regulation amount of the reticle by the stage device, and the controller is configured to calculate the regulation amount of the optical element and the regulation amount of the reticle, that minimize the objective function, and to control the regulator and the stage device based on the calculated regulation amounts.

9. An exposure apparatus for exposing a substrate to radiant energy via a pattern of a reticle, the apparatus comprising:

a projection optical system including an optical element of which at least one of a position, orientation, and shape can be regulated, and configured to project light from the pattern onto the substrate;

a regulator configured to regulate the at least one of the position, orientation, and shape of the optical element; and a controller configured to calculate, using quadratic cone programming, a regulation amount of the optical element, that minimizes a value of an objective function expressed by a first dummy variable serving as an upper limit of a linear optical characteristic value of the projection optical system that is expressed by a linear function of a regulation amount of the optical element by the regulator, and a second dummy variable serving as an upper limit of a quadratic optical characteristic value of the projection optical system expressed by a quadratic function of a regulation amount of the optical element by the regulator, and to control the regulator based on the calculated regulation amount.

10. The apparatus according to claim 9, wherein the linear optical characteristic value is a value of an optical characteristic expressed by a linear combination of wavefront aberration coefficients.

11. The apparatus according to claim 9, wherein the linear optical characteristic value is a value of a distortion as an aberration of the projection optical system.

12. The apparatus according to claim 9, wherein the quadratic optical characteristic value is a value of an optical characteristic expressed by a weighted sum of squares of wavefront aberration coefficients.

13. The apparatus according to claim 12, wherein the wavefront aberration coefficients are Zernike coefficients.

14. The apparatus according to claim 9, wherein the quadratic optical characteristic value is a square of an RMS value of wavefront aberration.

15. The apparatus according to claim 9, further comprising a stage device configured to hold the substrate and regulate at least one of a position and orientation of the substrate, wherein the linear optical characteristic value includes an optical characteristic value of the projection optical system expressed by a linear function of a regulation amount of the substrate by said stage device, the quadratic optical characteristics value includes an optical characteristics value of said projection optical system expressed by a quadratic function of a regulation amount of the substrate by the stage device, and the controller is configured to calculate the regulation amount of the optical element and the regulation amount of the substrate, that minimize the objective function, and to control the regulator and the stage device based on the calculated regulation amounts.

16. The apparatus according to claim 9, further comprising a stage device configured to hold the reticle and regulate at least one of a position and orientation of the reticle, wherein the linear optical characteristic value includes an optical characteristics value of the projection optical system expressed by a linear function of a regulation amount of the reticle by the stage device, the quadratic optical characteristic value includes an optical characteristics value of the projection optical system expressed by a quadratic function of an regulation amount of the reticle by the stage device, and the controller is configured to calculate the regulation amount of the optical element and the regulation amount of the reticle, that minimize the objective function, and to control the regulator and the stage device based on the calculated regulation amounts.

17. A method of manufacturing a device, the method comprising:
exposing a substrate to radiant energy using an exposure apparatus;
developing the exposed substrate; and
processing the developed substrate to manufacture the device,
wherein the exposure apparatus includes:
a projection optical system including an optical element of which at least one of a position, orientation, and shape can be regulated, and configured to project light from the pattern onto the substrate;
a regulator configured to regulate the at least one of the position, orientation, and shape of the optical element; and
a controller configured to calculate, using quadratic programming, a regulation amount of the optical element that minimizes a value of an objective function expressed by a first dummy variable serving as an upper limit of a linear optical characteristic value of the projection optical system that is expressed by a linear function of a regulation amount of the optical element by the regulator, and a second dummy variable serving as an upper limit of a quadratic optical characteristic value of the projection optical system that is expressed by a quadratic function of a regulation amount of the optical element by the regulator, and to control the regulator based on the calculated regulation amount.

18. A method of manufacturing a device, the method comprising:
exposing a substrate to radiant energy using an exposure apparatus;
developing the exposed substrate; and
processing the developed substrate to manufacture the device,
wherein the exposure apparatus includes:
a projection optical system including an optical element of which at least one of a position, orientation, and shape can be regulated, and configured to project light from the pattern onto the substrate;
a regulator configured to regulate the at least one of the position, orientation, and shape of the optical element; and
a controller configured to calculate, using quadratic cone programming, a regulation amount of the optical element, that minimizes a value of an objective function expressed by a first dummy variable serving as an upper limit of a linear optical characteristic value of the projection optical system that is expressed by a linear function of a regulation amount of the optical element by the regulator, and a second dummy variable serving as an upper limit of a quadratic optical characteristic value of the projection optical system expressed by a quadratic function of a regulation amount of the optical element by the regulator, and to control the regulator based on the calculated regulation amount.

* * * * *